US008410664B2

(12) United States Patent
Shieh et al.

(10) Patent No.: US 8,410,664 B2
(45) Date of Patent: Apr. 2, 2013

(54) METHOD FOR CHANGING ULTRASOUND WAVE FREQUENCY BY USING THE ACOUSTIC MATCHING LAYER

(75) Inventors: Tzong-Lin Jay Shieh, Taipei (TW); Wen-Shiang Chen, Taipei (TW); Chung-Ting Ko, Taipei (TW); Chuin-Shan Chen, Taipei (TW)

(73) Assignee: National Taiwan University (TW)

( * ) Notice: Subject to any disclaimer, the term of this patent is extended or adjusted under 35 U.S.C. 154(b) by 194 days.

(21) Appl. No.: 12/662,701

(22) Filed: Apr. 29, 2010

(65) Prior Publication Data

US 2010/0283355 A1 Nov. 11, 2010

(30) Foreign Application Priority Data

May 6, 2009 (TW) ................................ 98114939 A

(51) Int. Cl.
*H01L 41/053* (2006.01)

(52) U.S. Cl. .......................... 310/334; 310/322; 310/327

(58) Field of Classification Search .................. 310/327, 310/322, 334
See application file for complete search history.

(56) References Cited

U.S. PATENT DOCUMENTS

| | | | | |
|---|---|---|---|---|
| 5,637,800 | A * | 6/1997 | Finsterwald et al. | 73/642 |
| 6,540,683 | B1 * | 4/2003 | Lin | 600/447 |
| 6,989,625 | B2 * | 1/2006 | Suzuki et al. | 310/334 |
| 2006/0142659 | A1 * | 6/2006 | Okazaki et al. | 600/459 |
| 2007/0145860 | A1 * | 6/2007 | Aoki et al. | 310/334 |
| 2007/0226976 | A1 * | 10/2007 | Zipparo et al. | 29/25.35 |
| 2008/0312537 | A1 * | 12/2008 | Hyuga | 600/459 |

* cited by examiner

*Primary Examiner* — Walter Benson
*Assistant Examiner* — Bryan Gordon
(74) *Attorney, Agent, or Firm* — Bacon & Thomas, PLLC

(57) ABSTRACT

The method of changing ultrasound wave frequency by using the acoustic matching layer presents a replaceable acoustic matching layer to offer an effective means of filtering the original broadband frequency of an ultrasonic transducer into certain composite discontinuous frequencies. The filtering effect could be improved by connecting the electrodes of the acoustic matching layer when it is made of a poled piezoelectric material. This method may provide novel applications for commercial ultrasonic transducers.

2 Claims, 13 Drawing Sheets

METHOD FOR CHANGING ULTRASOUND WAVE FREQUENCY BY USING THE ACOUSTIC MATCHING LAYER

BACKGROUND OF THE INVENTION

1. Field of the Invention

The invention provides a method for changing sound wave frequency, particularly provides a method for changing the wave frequency of an ultrasonic transducer by using the acoustic matching layer.

2. Description of the Prior Art

The ultrasonic transducer exhibits its characteristics without destroying the target material's structure (e.g., the human cells) , thus it is generally applied to the sensing, measuring and medical applications. The wave generation of the ultrasonic transducer is typically provided by the ferroelectric ceramic or composite materials; which have much higher acoustic impedances than that of water or air; there will be a large amount of energy loss at the interface between the ferroelectric material and the transduction medium. Thus, an acoustic matching layer is required to reduce such a large impedance mismatch, in order to prevent great energy loss at the interface between the transducer and the measured matter, and to improve the efficiency of ultrasonic transmission.

At present, polymer and polymer-based composite materials are widely adopted to produce the passive-type acoustic matching layers. The matching layer with an acoustic impedance value between the acoustic impedance values of the ultrasonic transducer and the transduction medium can be designed to lower the mismatch of acoustic impedances at the interfaces.

At present, most acoustic matching layers are made of polymer and polymer-based composite materials. The acoustic impedance (Z) of the matching layer can be adjusted by varying the mixing ratio of the ceramic/metal powders and polymer, achieving a value of the following:

$$Z_{acoustic\ matching\ layer}=\sqrt{Z_{\mathrm{transducer}}\times Z_{\mathrm{transduction}\,medium}}.$$

In addition, the ceramic/metal-polymer composite materials can be easily processed, and precisely cut to the required thickness (i.e. a quarter of the wavelength of ultrasound wave in the matching layer material). Thus, the above-mentioned passive-type acoustic matching layer design has been widely adopted in the transducer industry.

As shown in U.S. Pat. No. 6,989,625, the acoustic matching layer is made of silicon dioxide gel, and the thickness of the acoustic matching layer is equal to the quarter of the wavelength of ultrasound wave travelling in this material. As shown in another U.S. Pat. No. 6,969,943, the acoustic matching layer is made of the mixture of polymer and silicon dioxide, or aluminum oxide gel, and the thickness of the acoustic matching layer is equal to the quarter of the wavelength of ultrasound wave in this material. As shown in another U.S. Pat. No. 5,418,759, the acoustic matching layer is made of the mixture of copper powder and epoxy, and the thickness of the acoustic matching layer is equal to the quarter of the wavelength of ultrasound wave in this material.

However, the existing acoustic matching layers are not capable of filtering and adjusting the output frequency of the acoustic component actively. The output frequency of a commercial ultrasonic probe is typically kept at a constant. If two different output frequencies are required, two ultrasonic probes must be adopted and their focuses are overlapped at the same spot. However, the acoustic confocal procedure is difficult to achieve precisely, making it undesirable in many applications.

SUMMARY OF THE INVENTION

The invention relates to a method for changing ultrasound wave frequency by using the acoustic matching layer. It exploits an acoustic matching layer to change the frequency response of an ultrasound transducer.

The acoustic matching layer of the invention can be made of various ceramics, polymer and composite materials, such as the ceramic-polymer composites, metal-polymer composites, engineering ceramics, and various piezoelectric materials.

The acoustic matching unit of the invention can be made of a single or multiple material layers. The filtering effect of the matching layer(s) is used to adjust the output frequency of the acoustic element, or to produce an ultrasound profile consisting of composite discontinuous frequencies.

The acoustic matching unit of the invention can filter the original broadband frequency of an ultrasound transducer into a narrow characteristic frequency or the composite of several distinct frequencies. If the acoustic matching layer is made of poled piezoelectric materials, by connecting the upper and lower electrodes, an even narrow frequency profile can be obtained.

In addition, the acoustic matching unit of the invention can be applied to non-destructive inspections, for example, it can provide the medical ultrasound probe with the ability to change its characteristic frequency. The low-frequency ultrasound wave has a longer wavelength and exhibits better propagation properties. The high-frequency ultrasound wave in contrast has a shorter wavelength and exhibits a higher spatial resolution. The composite frequency profile provided by the current invention can process the benefits of both high and low ultrasound frequencies.

BRIEF DESCRIPTION OF THE DRAWINGS

The foregoing aspects and many of the attendant advantages of this invention will become more readily appreciated and better understood by reference to the following detailed description, when taken in conjunction with the accompanying drawings, wherein.

DESCRIPTION OF THE PREFERRED EMBODIMENT

The method of the invention for changing sound wave frequency by using the acoustic matching layer can be sufficiently understood through the following embodiments, and the person who skilled in the art can completely enable the invention, however, the implementation of the invention is not limited to the following embodiments.

Figure 1:
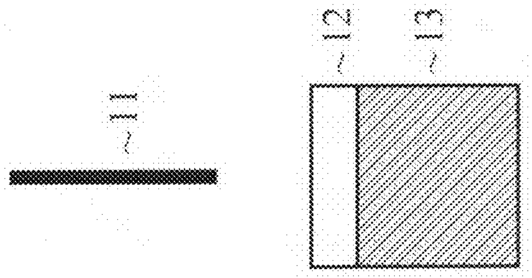
FIG. 1 is a schematic showing the measuring system for a piezoelectric acoustic matching layer of the invention.
Figure 2:
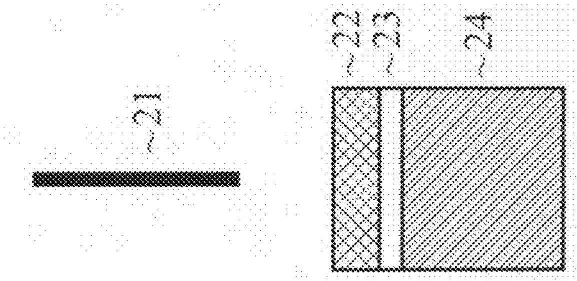
FIG. 2 is a schematic showing the measuring system for a double-layer acoustic matching unit of the invention.
Figure 3A:
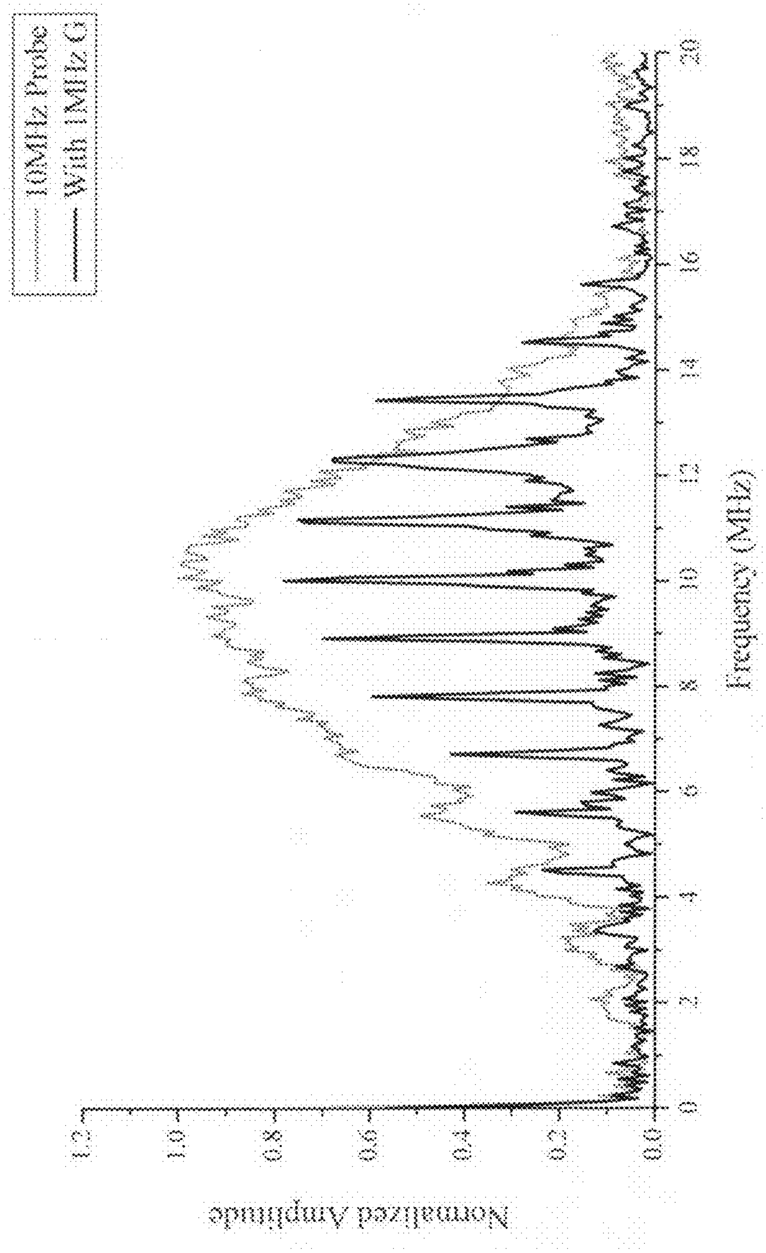
FIGS. 3A, 3B, 3C and 3D show the output waveforms of a broadband 10 MHz ultrasonic probe with and without Type G piezoelectric acoustic matching layer of (A) 1 MHz, (B) 2 MHz, (C) 3 MHz, and (D) 5 MHz according to an embodiment of the invention.
Figure 3B:
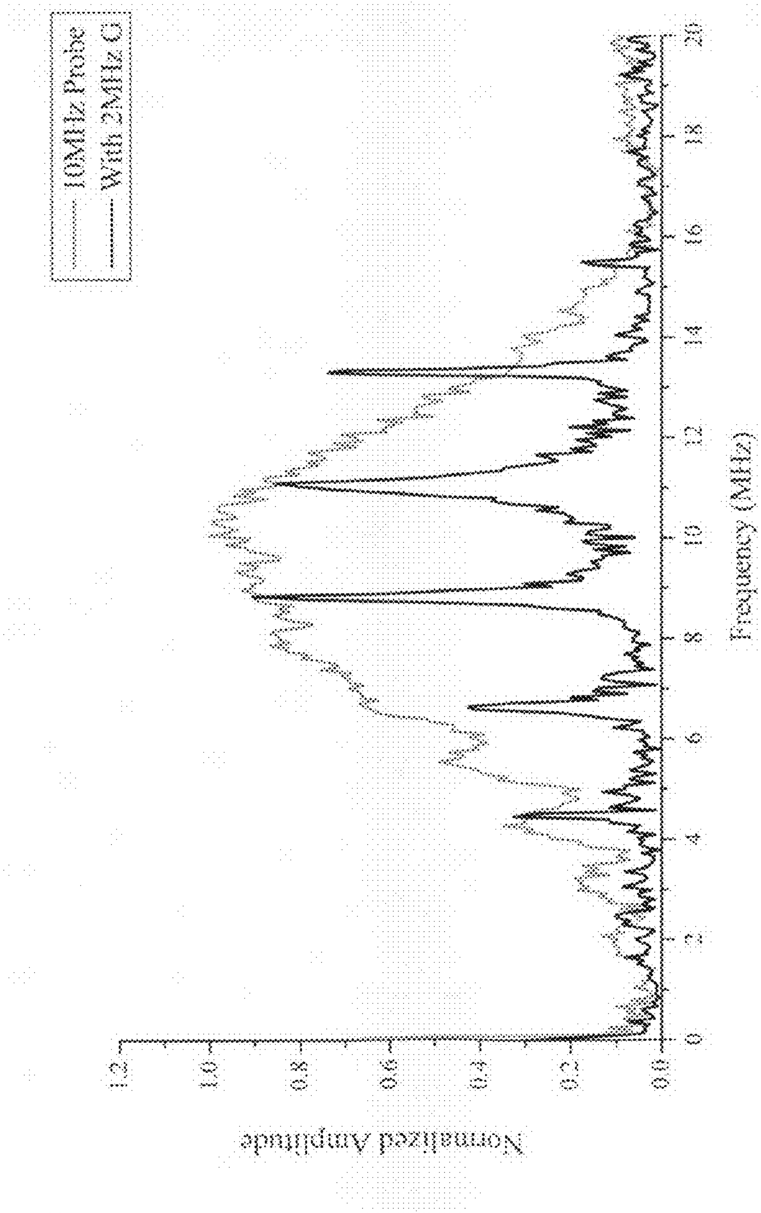
Figure 3C:
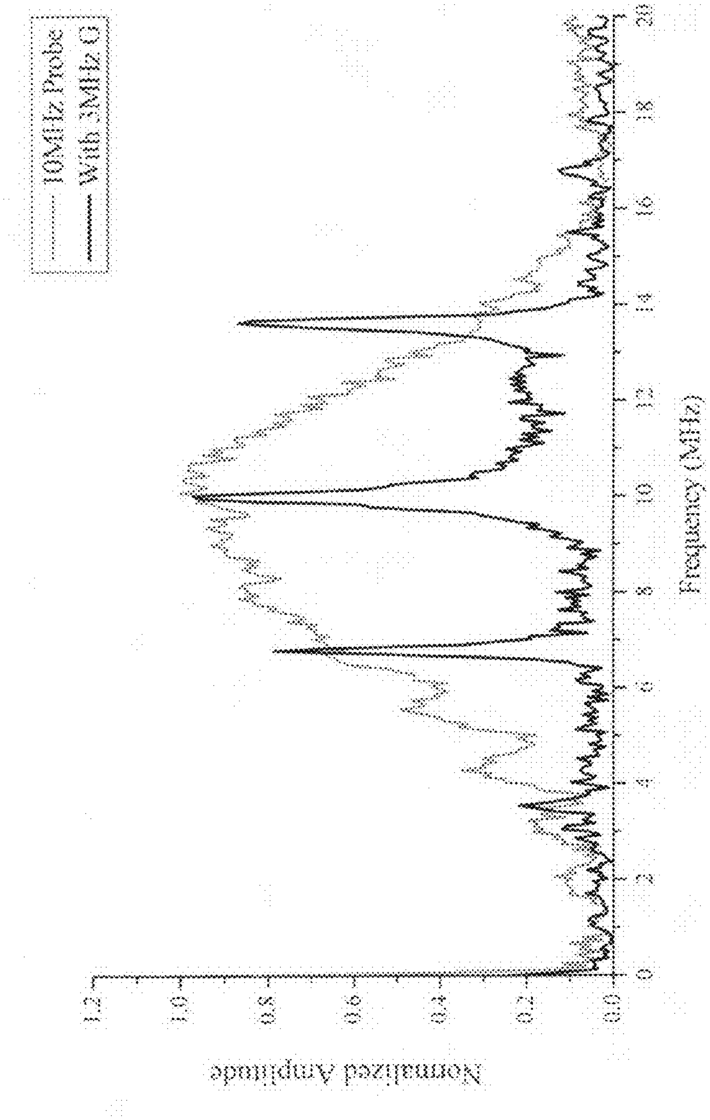
Figure 3D:
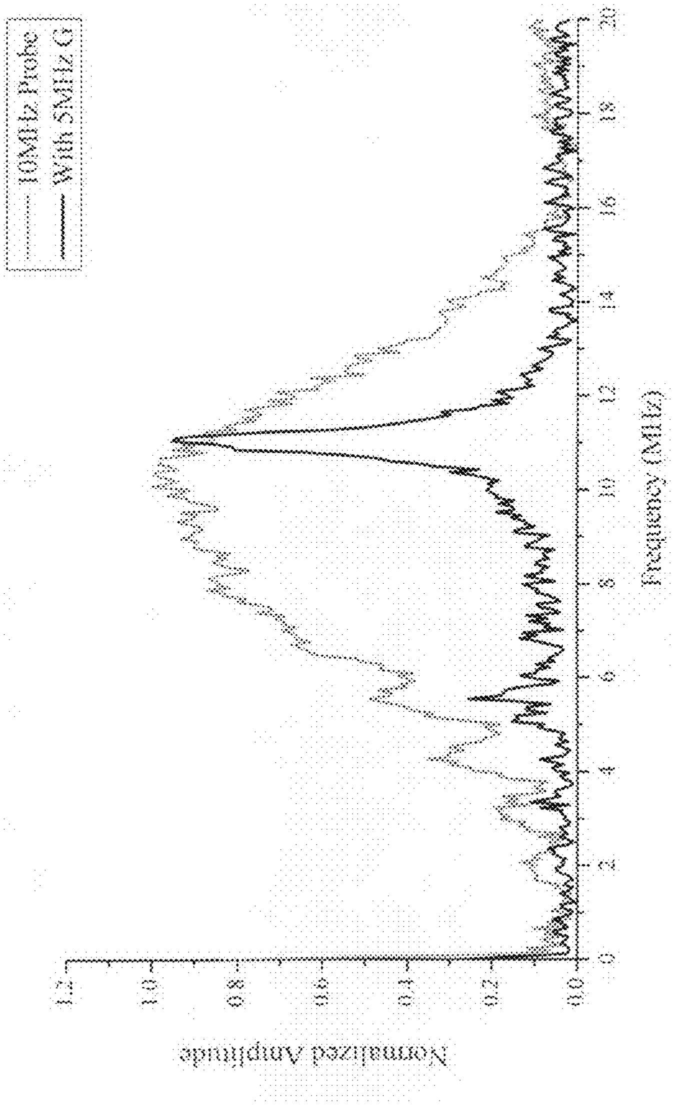
Figure 4A:
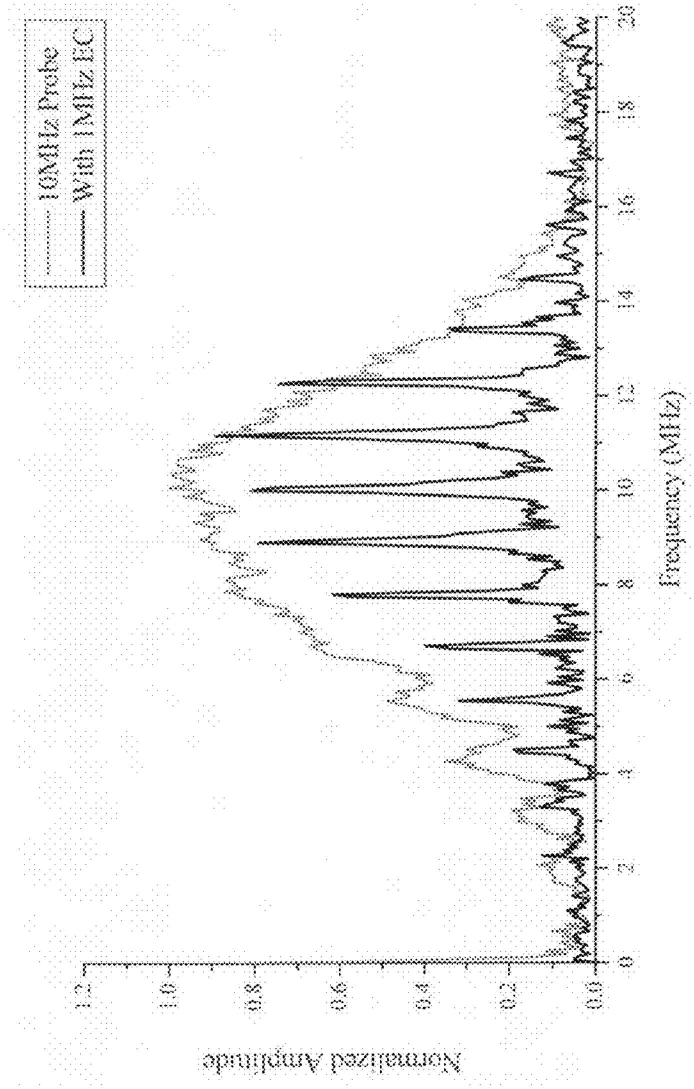
FIGS. 4A, 4B, 4C and 4D show the output waveform of a broadband 10 MHz ultrasonic probe with and without Type EC piezoelectric acoustic matching layer of (A) 1 MHz, (B) 2 MHz, (C) 3 MHz, and (D) 5 MHz according to an embodiment of the invention.
Figure 4B:
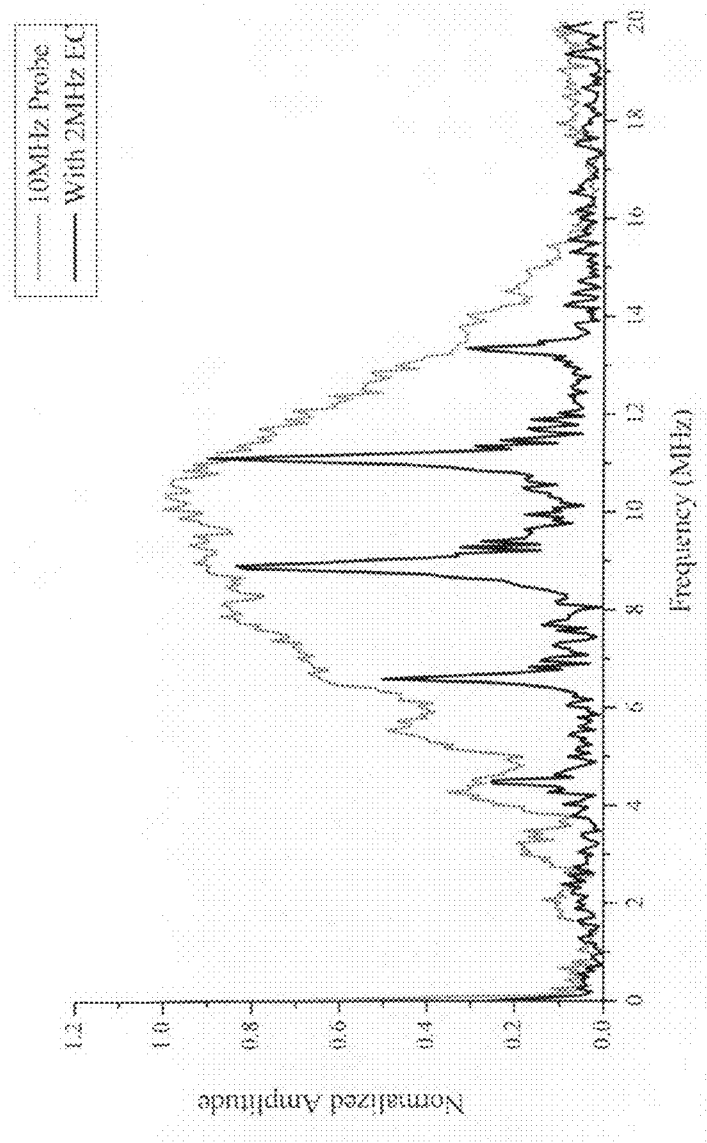
Figure 4C:
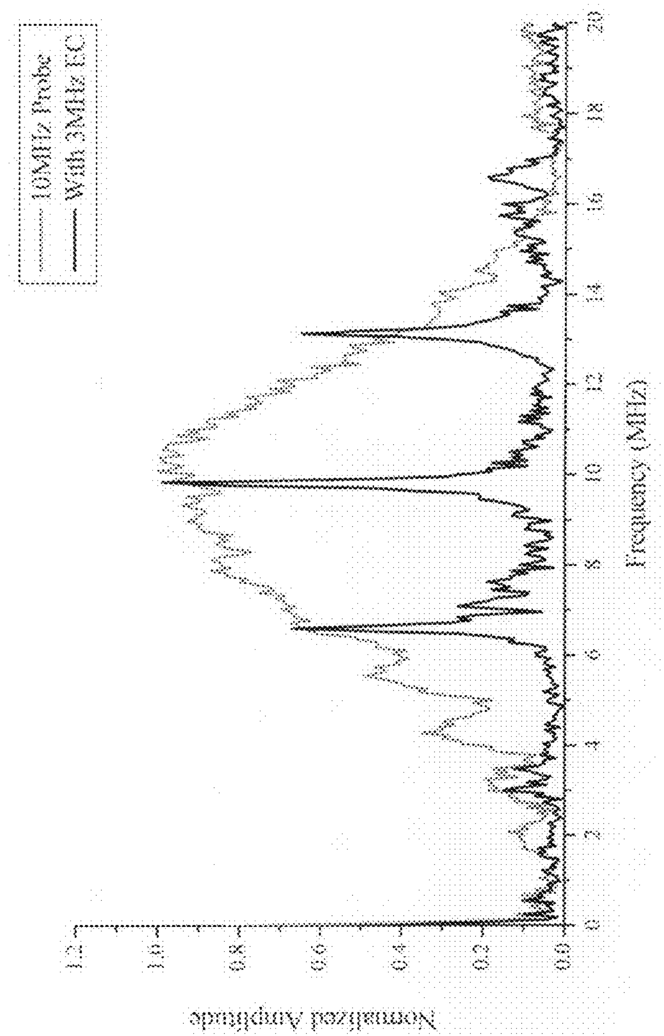
Figure 4D:
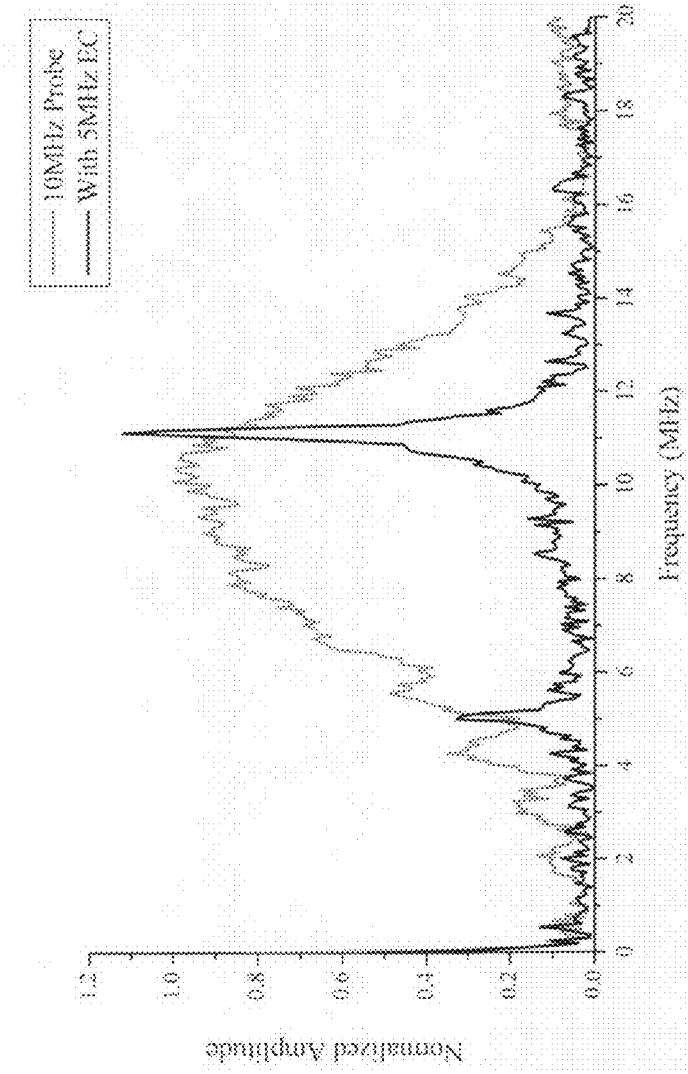

In the embodiments of the invention, a 10 MHz ultrasonic probe is used as an output source of ultrasound wave, in order to measure the acoustic filtering behaviors of a single piezoelectric matching layer and a double-layer acoustic matching unit. The structure of the measurement system is shown in FIG. 1 and FIG. 2. FIG. 1 shows the hydrophone 11, the piezoelectric acoustic matching layer 12, and the broadband 10 MHz ultrasonic probe 13. FIG. 2 shows the hydrophone 21, the matching layer 22, the matching layer 23, and the 10 MHz ultrasonic probe 24.

Embodiment 1:

Firstly, commercially poled lead zirconate titanate (PZT) plates with resonant frequencies of (A) 1 MHz, (B) 2 MHz, (C) 3 MHz, and (D) 5 MHz are chosen. In this embodiment, this kind of PZT plate is called "Type G" piezoelectric acoustic matching layer.

Then, the hydrophone 11 is used to measure the original waveform of the 10 MHz ultrasonic probe 13 and the output waveform when Type G piezoelectric acoustic matching layer 12 is combined. The results are shown in FIG. 3A, FIG. 3B, FIG. 3C and FIG. 3D. When Type G piezoelectric acoustic matching layer 12 is combined onto the 10 MHz ultrasonic probe 13, the output waveform consisting of a frequency and its higher harmonic frequencies can be formed in accordance with the resonant frequency of the commercially poled lead zirconate titanate (PZT) plates.

In addition, the thickness of Type G piezoelectric acoustic matching layer 12 is a half-wavelength of the characteristic ultrasound wave propagating within the Type G piezoelectric acoustic matching layer 12 itself.

Embodiment 2:

Firstly, commercially poled PZT plates with resonant frequencies of (A) 1 MHz, (B) 2 MHz, (C) 3 MHz, and (D) 5 MHz are chosen. The top and bottom electrodes of the PZT plates are connected with conductive silver paints. In this embodiment, this kind of PZT plate is called "Type EC" piezoelectric acoustic matching layer.

Then, the hydrophone 11 is used to measure the original waveform of the 10 MHz ultrasonic probe 13 and the output waveform when Type EC piezoelectric acoustic matching layer 12 is combined. The results are shown in FIG. 4A, FIG. 4B, FIG. 4C and FIG. 4D. When Type EC piezoelectric acoustic matching layer 12 is combined onto the ultrasonic probe, an output waveform consisting of a frequency and its higher harmonic frequencies can be formed in accordance with the resonant frequency of the commercially poled lead zirconate titanate (PZT) plates. Comparing to the results of embodiment 1, the noise level and bandwidth of the characteristic frequencies are reduced significantly.

Embodiment 3:

Firstly, a commercially unpoled PZT plate is selected. The unpoled PZT plate exhibits no piezoelectric properties. In this embodiment, this kind of PZT plate is called "Type U" acoustic matching layer.

A precision cutting machine is used to machine the Type U acoustic matching layer into a thickness of a half-wavelength of 2 MHz ultrasound wave propagating within the matching layer itself. The Type U acoustic matching layer can be either layer 22 or layer 23 as shown in FIG. 2.

Figure 5:
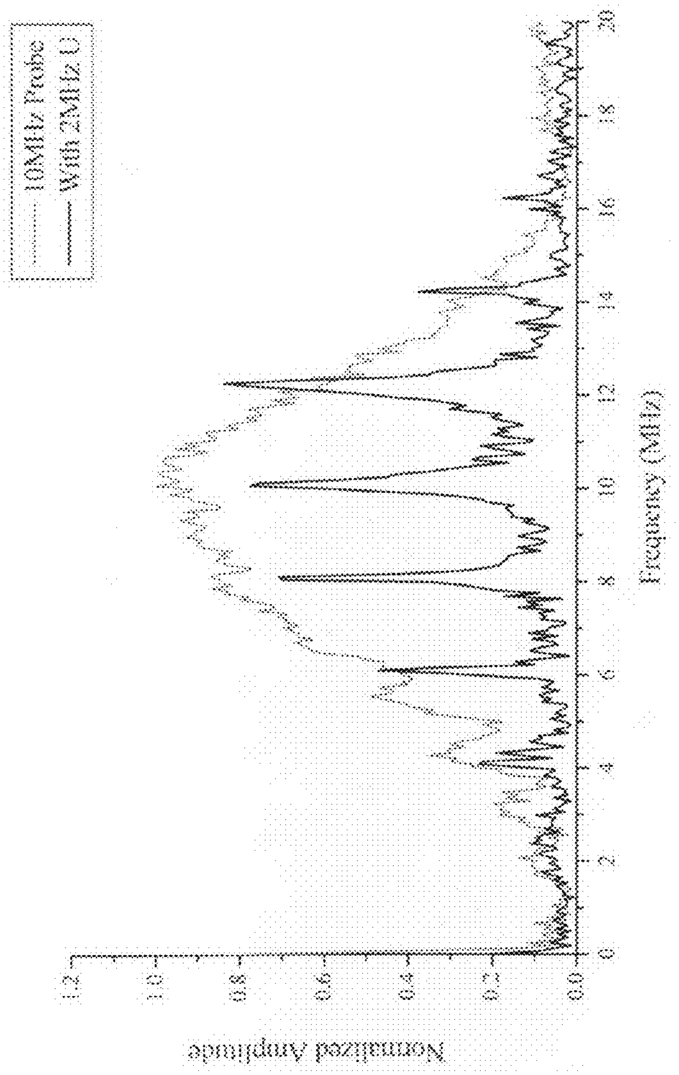
FIG. 5 shows the output waveforms of a broadband 10 MHz ultrasonic probe with and without Type U acoustic matching layer according to an embodiment of the invention.

Then, the hydrophone 21 is used to measure the original waveform of the 10 MHz ultrasonic probe 24 and the output waveform when Type U acoustic matching layer is combined into. The results are shown in FIG. 5. When Type U acoustic matching layer with a specific thickness is combined onto the ultrasonic probe, an output waveform consisting of 2 MHz and its higher harmonic frequencies can be formed.

Embodiment 4:

Aluminum oxide ($Al_2O_3$) powder is mixed with 5 wt% polyvinyl chloride (PVC) powder (acting as a binder).The mixture is placed in a PE vessel with alcohol added and ground into a slurry by ball-milling for 24 hours. The alcohol is then removed by a pressure-reducing drying method. The resultant powder is dried in an oven at 80° C. to 120° C. for 24 hours, and then ground and sieved through 100 mesh screen. The drying step is repeated for the screened powder. The resultant powder is pressed into disc specimens with a diameter of 25 mm under a compressive stress of about 3.5 MPa.

Sintering of the disc specimens is achieved at 1600° C. for one hour. In this embodiment, the sintered aluminum oxide specimen is called "Type A" acoustic matching layer.

A precision cutting machine is used to machine the Type A acoustic matching layer into a thickness of a half-wavelength of 2 MHz ultrasound wave propagating within the matching layer itself. The Type A acoustic matching layer can be used as either layer 22 or layer 23 as shown in FIG. 2.

Figure 6:
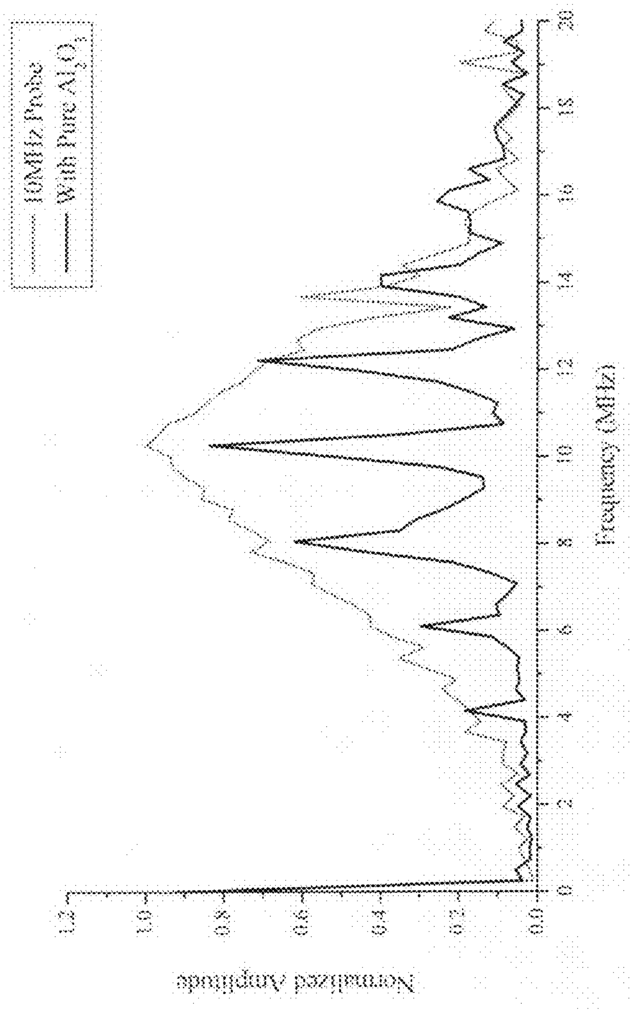
FIG. 6 shows the output waveforms of a broadband 10 MHz ultrasonic probe with and without Type A acoustic matching layer according to an embodiment of the invention.

Then, the hydrophone 21 is used to measure the original waveform of the 10 MHz ultrasonic probe 24 and the output waveform when Type A acoustic matching layer is combined. The results are shown in FIG. 6. When Type A acoustic matching layer with a specific thickness is combined onto the ultrasonic probe, an output waveform consisting of 2 MHz and its higher harmonic frequencies can be formed.

Embodiment 5:

Aluminum oxide ($Al_2O_3$) powder is mixed with 20 vol% polyvinyl chloride (PVC) powder (acting as a binder). The mixture is placed in a PE vessel with alcohol added and ground into a slurry by ball-milling for 24 hours. The alcohol is then removed by a pressure-reducing drying method. The resultant powder is dried in an oven at 80° C. to 120° C. for 24 hours, and then ground and sieved through 100 mesh screen. The drying step is repeated for the screened powder. The resultant powder is pressed into disc specimens with a diameter of 25 mm under a compressive stress of about 3.5 MPa.

Sintering of the disc specimens is achieved at 1600° C. for one hour. The sintered aluminum oxide disc specimens are porous and used as templates to form ceramic-polymer composites. This is achieved by injecting epoxies into the pores of the aluminum oxide specimens. In the embodiment, the aluminum oxide-epoxy composite is called "Type A-E" acoustic matching layer.

A precision cutting machine is used to machine the Type A-E acoustic matching layer into a thickness of a half-wavelength of 2 MHz ultrasound wave propagating within the matching layer itself. The Type A-E acoustic matching layer can be either layer 22 or layer 23 as shown in FIG. 2.

Figure 7:
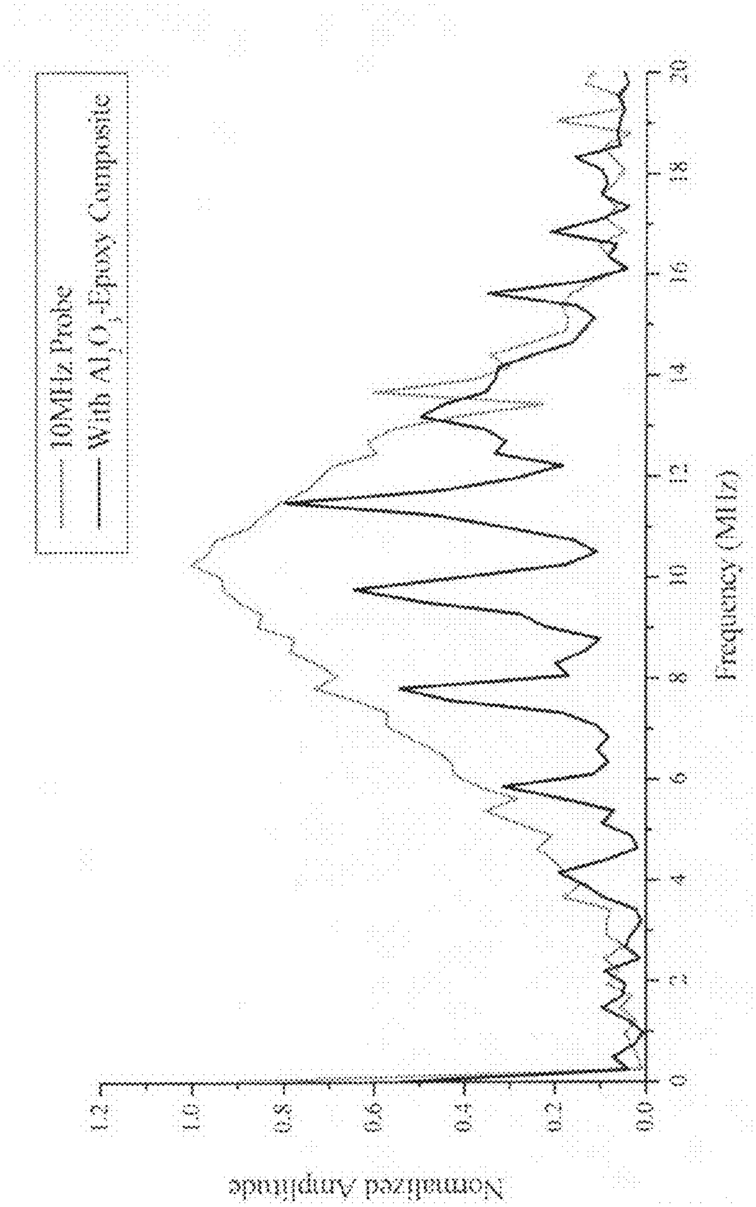
FIG. 7 shows the output waveforms of a broadband 10 MHz ultrasonic probe with and without Type A-E composite acoustic matching layer according to an embodiment of the invention.

Then, the hydrophone 21 is used to measure the original waveform of the 10 MHz ultrasonic probe 24 and the output waveform when Type A-E acoustic matching layer is combined. The results are shown in FIG. 7. When Type A-E acoustic matching layer with a specific thickness is combined onto the ultrasonic probe, an output waveform consisting of 2 MHz and its higher harmonic frequencies can be formed.

Thus, the method for changing ultrasound wave frequency by using the acoustic matching layer comprises the followings:

Firstly, forming an acoustic matching layer is achieved, and then cutting the acoustic matching layer into a specific thickness is carried out. The specific thickness is of half the wavelength of the characteristic ultrasound wave in the acoustic matching layer itself. The acoustic matching layer is combined onto the ultrasonic probe to change the output waveform.

An ultrasonic probe of the invention comprises the following:

An ultrasound apparatus is provided and an acoustic matching layer is combined onto the ultrasound detecting apparatus to generate a specific output waveform. The installed acoustic matching layer is of a specific thickness—a half-wavelength of the characteristic ultrasound wave propagating in the acoustic matching layer itself.

In addition, the acoustic matching layer of the invention can be made of various ceramics, polymer and composite materials, such as the ceramic-polymer composites, metal-polymer composites, engineering ceramics, and various piezoelectric materials.

Summarizing the above descriptions, the method of the invention for changing ultrasound wave frequency by using the acoustic matching layer can be utilized in ultrasonic probes with a single or multiple acoustic matching layer designs. The acoustic matching layer developed is of a specific thickness—a half-wavelength of the characteristic ultrasound wave propagating in the acoustic matching layer itself. The filtering effect of the acoustic matching layer is used to adjust the output frequency spectrum of the acoustic element, so that the acoustic element can output a waveform of a certain frequency profile. The ultrasonic probe therefore can output composite frequencies and possess both high penetration and high resolution capabilities.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for changing ultrasound wave frequency by using piezoelectric acoustic matching layer having a specific thickness that being a half-wavelength of a characteristic ultrasound wave propagating within said piezoelectric acoustic matching layer itself, comprising:

providing an ultrasonic probe;

forming a piezoelectric acoustic matching layer by using poled lead zirconate titanate (PZT) plates with resonant frequencies selected from the group consisting of 1 MHz, 2 MHz, 3 MHz, and 5 MHz, said acoustic matching layer having a specific thickness being a half-wavelength of a characteristic ultrasound wave propagating within said acoustic matching layer itself; and combining said piezoelectric acoustic matching layer onto an ultrasonic probe for changing said ultrasound wave frequency as an output waveform, wherein said output waveform that being a frequency and its higher harmonic frequencies formed in accordance with a resonant frequency of said piezoelectric acoustic matching layer.

2. An ultrasonic apparatus by using piezoelectric acoustic matching layer having a specific thickness that being a half-wavelength of a characteristic ultrasound wave propagating within said acoustic matching layer itself and an ultrasonic probe, comprising:

an ultrasonic probe; and an piezoelectric acoustic matching layer having a specific thickness that being a half-wavelength of a characteristic ultrasound wave propagating within said acoustic matching layer itself, wherein said piezoelectric acoustic matching layers by using poled lead zirconate titanate (PZT) plates with resonant frequencies beinq selected from the group consisting of 1 MHz, 2 MHz, 3 MHz, and 5 MHz, said piezoelectric acoustic matching layer being combined onto said ultrasonic apparatus for changing an ultrasound wave frequency as an output waveform that being a frequency and its higher harmonic frequencies formed in accordance with a resonant frequency of said piezoelectric acoustic matching layer.

* * * * *